(12) United States Patent
Lee

(10) Patent No.: US 11,898,970 B2
(45) Date of Patent: Feb. 13, 2024

(54) EUV MASK INSPECTION DEVICE USING MULTILAYER REFLECTION ZONE PLATE

(71) Applicant: ESOL Inc., Hwaseong-si (KR)

(72) Inventor: Dong Gun Lee, Hwaseong-si (KR)

(73) Assignee: ESOL Inc., Hwaseong-si (KR)

( * ) Notice: Subject to any disclaimer, the term of this patent is extended or adjusted under 35 U.S.C. 154(b) by 296 days.

(21) Appl. No.: 17/570,407

(22) Filed: Jan. 7, 2022

(65) Prior Publication Data

US 2023/0121748 A1    Apr. 20, 2023

(30) Foreign Application Priority Data

Oct. 15, 2021    (KR) ......................... 10-2021-0137574

(51) Int. Cl.
*G01N 21/55*    (2014.01)
*G01N 21/956*    (2006.01)
*G03F 1/22*    (2012.01)

(52) U.S. Cl.
CPC ........... *G01N 21/956* (2013.01); *G01N 21/55* (2013.01); *G03F 1/22* (2013.01); *G01N 2021/95676* (2013.01)

(58) Field of Classification Search
None
See application file for complete search history.

(56) References Cited

U.S. PATENT DOCUMENTS

| | | | |
|---|---|---|---|
| 6,738,135 B1 * | 5/2004 | Underwood | G01N 21/956 |
| | | | 356/237.5 |
| 7,738,135 B2 | 6/2010 | Morita | |
| 2015/0002925 A1 * | 1/2015 | Endres | G03F 7/70116 |
| | | | 359/351 |
| 2019/0235387 A1 * | 8/2019 | Na | G03F 1/84 |
| 2022/0384358 A1 * | 12/2022 | Lee | G03F 7/70683 |

FOREIGN PATENT DOCUMENTS

| | | |
|---|---|---|
| KR | 10-1258344 B1 | 4/2013 |
| KR | 10-1370203 B1 | 3/2014 |
| KR | 10-1606227 B1 | 3/2016 |
| KR | 10-2021-0043701 A | 4/2021 |

* cited by examiner

*Primary Examiner* — Hoon K Song
(74) *Attorney, Agent, or Firm* — Revolution IP, PLLC

(57) ABSTRACT

An EUV mask inspection device includes: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate. The EUV mask inspection device further includes: an aperture for providing monochromatic light or reducing a light radiation area by reducing a linewidth of optical wavelength radiated from the EUV lighting unit; a transmissive zone plate for forming expanded light by collecting reflected or scattered light after radiating light passing through the aperture to the EUV mask; and an image sensor for measuring intensity of light through EUV mask measured light.

9 Claims, 14 Drawing Sheets

Check existence of defect & check defect position (x, y)

Move stage to move the defect to a place which has the best image resolution

EUV MASK INSPECTION DEVICE USING MULTILAYER REFLECTION ZONE PLATE

BACKGROUND OF THE INVENTION

Field of the Invention

The present invention relates to an EUV mask inspection device using a multilayer reflection zone plate, and more particularly, to an EUV mask inspection device using a multilayer reflection zone plate for a metrology and inspection system of an EUV blank mask used for forming a fine pattern using an EUV exposure process during a semiconductor device manufacturing process.

Background Art

Recently, an EUV exposure machine for manufacturing a semiconductor device using EUV light with a wavelength of 13.5 nm has been introduced into a semiconduction manufacturing process. The EUV exposure machine uses a wavelength shorter than the existing ArF exposure machine having a wavelength of 193 nm so as to be advantageous for miniaturization of the device. It is expected that an EUV exposure machine or a beyond EVU (called a BUV) exposure machine with a wavelength of about 6.7 nm which is advantageous for further miniaturization using a shorter wavelength will be introduced into a semiconductor manufacturing process.

The EUV exposure machine having the shorter wavelength than the existing EUV exposure machine is an EUV mask using a blank mask to form a fine pattern. The EUV mask has a structure different from that of the existing ArF exposure machine. That is, the EUV mask has not a transmission structure but a reflection structure, and has reflectivity optimized to a wavelength of 13.5 nm or a wavelength of 6.7 nm (in the case of BUV).

There are lots of metrology and inspection systems using EUV light during an EUV mask manufacturing process. Especially, a defect inspection of an EUV blank mask pattern using an EUV inspection system is a key process which directly has an influence on a wafer yield because defects of the blank mask are all repeatedly transferred to a wafer.

The defect pattern detected through the mask inspection can be corrected through a correction process, and success or failure can be confirmed by a method of confirming through SEM review after directly exposing to a wafer using a wafer exposure machine. However, because it takes a lot of time and money, in the current mask manufacturing process, the confirming method is applied to previously verify the influence of a pattern on the wafer at low cost utilizing a mask inspection device of a microscopic structure which can emulate a wafer exposure optical system.

FIG. 1 is a configuration diagram of an EUV inspection device according to a conventional art. U.S. Pat. No. 7,738,135 discloses an EUV inspection device. In the EUV inspection device, a collector mirror collects EUV light, and the collected EUV light is transferred to an illumination adjusting optical system. The illumination adjusting optical system has two facet optical devices having mirror arrays to adjust intensity distribution according to an incidence angle of beam applied to a sample, and two EUV mirrors to finally illuminate the sample. The conventional EUV lighting apparatus requires lots of development expenses of the illumination optical system and is very difficult to manufacture and install required components since at least five EUV optical components are applied.

As described above, the conventional technology requires a lot of optical components, is complicated in structure, requires increased expenses, and is difficult in maintenance.

As a result, it is necessary to introduce equipment for inspecting an EUV mask. However, the total cost of equipment is increased and an equipment delivery period is considerably long due to high development cost of the EUV optical system which is a core part of inspection equipment. Therefore, it is necessary to develop an EUV mask inspection device to which a new EUV optical system is applied so as to reduce the number of EUV optical components and reduce a manufacturing period of time.

PATENT LITERATURE

Patent Documents

US Patent Publication No. 2015-0002925
U.S. Pat. No. 7,738,135
Korean Patent No. 10-1370203
Korean Patent Publication No. 10-2021-0043701
Korean Patent No. 10-1258344
Korean Patent No. 10-1606227

SUMMARY OF THE INVENTION

Accordingly, the present invention has been made to solve the above-mentioned problems occurring in the prior arts, and it is an object of the present invention to provide an EUV mask inspection device using a multilayer reflection zone plate which can emulate an illuminator of an exposure machine onto a mask inspection device of a microscopic structure. Especially, it is another object of the present invention to provide an EUV mask inspection device using a multilayer reflection zone plate, which can emulate free-form pupil illumination of an EUV exposure machine or provide uniform illumination beam required in an EUV inspection system by adjusting a duty cycle of a pattern or the height of an absorber by each position on a multilayer reflection zone plate, thereby precisely inspecting an EUV mask.

To accomplish the above object, according to the present invention, there is provided an EUV mask inspection device using a multilayer reflection zone plate for metrology and inspection of an EUV mask used in an EUV exposure process during a semiconductor device manufacturing process, which comprises: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate, and the EUV mask inspection device including: an aperture for providing monochromatic light or reducing a light radiation area by reducing a linewidth of optical wavelength radiated from the EUV lighting unit; a transmissive zone plate for forming expanded light by collecting reflected or scattered light after radiating light passing through the aperture to the EUV mask; and an image sensor for measuring intensity of light through EUV mask measured light, which is the light passing through the transmissive zone plate.

Moreover, the multilayer reflection zone plate includes: one planar substrate; an EUV reflective multilayer film stacked on the planar substrate; and a zone plate pattern formed on the surface or the inner face of the EUV reflective multilayer film.

Furthermore, the zone plate pattern is formed on the EUV reflective multilayer film by repeatedly stacking at least two or more reflective materials, and the zone plate pattern is formed in such a way that absorber materials are stacked along a predetermined pattern, that the EUV reflection multilayer film is etched along the predetermined pattern, or that an absorber material is stacked and the EUV reflection multilayer film is stacked on the absorber material.

Additionally, the zone plate pattern is formed on the surface or the inner face of the EUV reflective multilayer film in such a way that absorber materials are stacked along a predetermined pattern, that the EUV reflection multilayer film is etched along the predetermined pattern, or that an absorber material is stacked and the EUV reflection multilayer film is stacked on the absorber material.

In addition, the absorber for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

Moreover, the zone plate pattern adjusts the $1^{st}$ light intensity by adjusting the height or the duty cycle of the absorber, and adjusts intensity distribution by angles of beam by spatially adjusting the $1^{st}$ light intensity in the multilayer reflection zone plate.

Furthermore, the zone plate pattern has a circular or oval shape, the zone plate is an off-axis zone plate that the center of the circular or oval pattern does not exist in the multilayer reflection zone plate, or is an on-axis zone plate that the center of the circular or oval pattern exists in the multilayer reflection zone plate. In the case of the off-axis zone plate, the center of zeroth light and the center of first light head in different directions, and in the case of the on-axis zone plate, the center of zeroth light and the center of first light are in the same direction.

Additionally, the zone plate pattern determines whether or not diffraction of light exists by spatially adjusting whether or not a zone plate pattern exists on the multilayer reflection zone plate so as to embody binary illumination.

In addition, when a duty cycle of a zone plate pattern or the height of absorber is spatially adjusted on the multilayer reflection zone plate, intensity of $1^{st}$ diffraction light in the spatial part is adjusted so as to embody freeform pupil illumination or pixelated pupil illumination.

Moreover, the EUV mask inspection device further includes a stage for transferring the EUV mask, which is the inspection target, in X-axis and Y-axis directions. After X and Y values at the position of the defect generated during the $1^{st}$ measurement process are detected, the stage is operated to move the position of the defect from the measured light to the center with higher resolution, and then, detects the defect of the EUV mask through the $1^{st}$ measurement.

Furthermore, the EUV mask inspection device further includes a plurality of reflection mirrors 900 for controlling the direction of output measured light by determining the location of the lighting unit. The EUV mask inspection device which has at least one reflection mirror can determine the location and direction of the lighting unit and determine the optical path of the EUV mask inspection device.

Additionally, the reflection mirror may be one or a combination of two selected from a plane mirror, a concave mirror, an elliptic mirror, and a toroidal mirror.

In addition, the reflection mirror includes an EUV reflective multilayer film stacked on the surface thereof, and a zone plate pattern formed on the surface or the inner face of the EUV reflective multilayer film.

The inspection device according to the present invention can be easily applied to apparatuses, is short in a development period of time, and requires low expenses since having a smaller number of components than the conventional optical system having the existing mirror.

Because the reflection zone plate not to which the existing oblique incidence reflection zone plate parts are applied does not have the multilayer film, beam is injected into the zone plate at oblique incidence (at an incidence angle of 86 degrees) for soft ray reflection and solid angles collected to the zone plate are small. Therefore, the present invention can solve the problem that light harvesting efficiency is deteriorated.

Additionally, the EUV lighting apparatus to which the multilayer reflection zone plate is applied can greatly increase light harvesting efficiency since injecting light to the zone plate at angles close to vertical angles, for example, at an incidence angle of about 6 degrees, and can increase light harvesting efficiency in a large area in the case of incoherent light sources which spread widely since a multilayer film which is a reflector is formed on a thick substrate to be capable of having a large area.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Hereinafter, an extreme ultraviolet (EUV) mask inspection device using a multilayer reflection zone plate according to the present invention will be described in detail with reference to the accompanying drawings.

In the case of the EUV mask inspection device using a multilayer reflection zone plate according to the present invention, an EUV lighting device for metrology and inspection of an EUV mask in an EUV exposure process of a semiconductor device manufacturing process includes: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate. The EUV mask inspection device further includes: an aperture for providing monochromatic light or reducing a light radiation area by reducing a linewidth of optical wavelength radiated from the EUV lighting unit; a transmissive zone plate for forming expanded light by collecting reflected or scattered light after radiating light passing through the aperture to the EUV mask; and an image sensor for measuring intensity of light through EUV mask measured light, which is the light passing through the transmissive zone plate.

An EUV exposure machine for manufacturing semiconductor chips needs to uniformly radiate light to an EUV mask in a wide area, and uses the existing lighting technology which can secure a wide exposure area even though an expensive complicated optical system is applied since there are lots of demanded wafer output per unit time. However, if the EUV lighting technology used in the EUV exposure machine is applied to an EUV mask inspection device, an equipment development period is extended, equipment development expenses are increased, and a technical risk in equipment development is increased. Fortunately, because the output of the EUV mask is much less than the wafer output, the EUV inspection device lights a narrow area in the EUV mask, inspects the area using a magnifying optical system, and a method of scanning and inspecting the EUV mask at high speed is applied.

Figure 1:
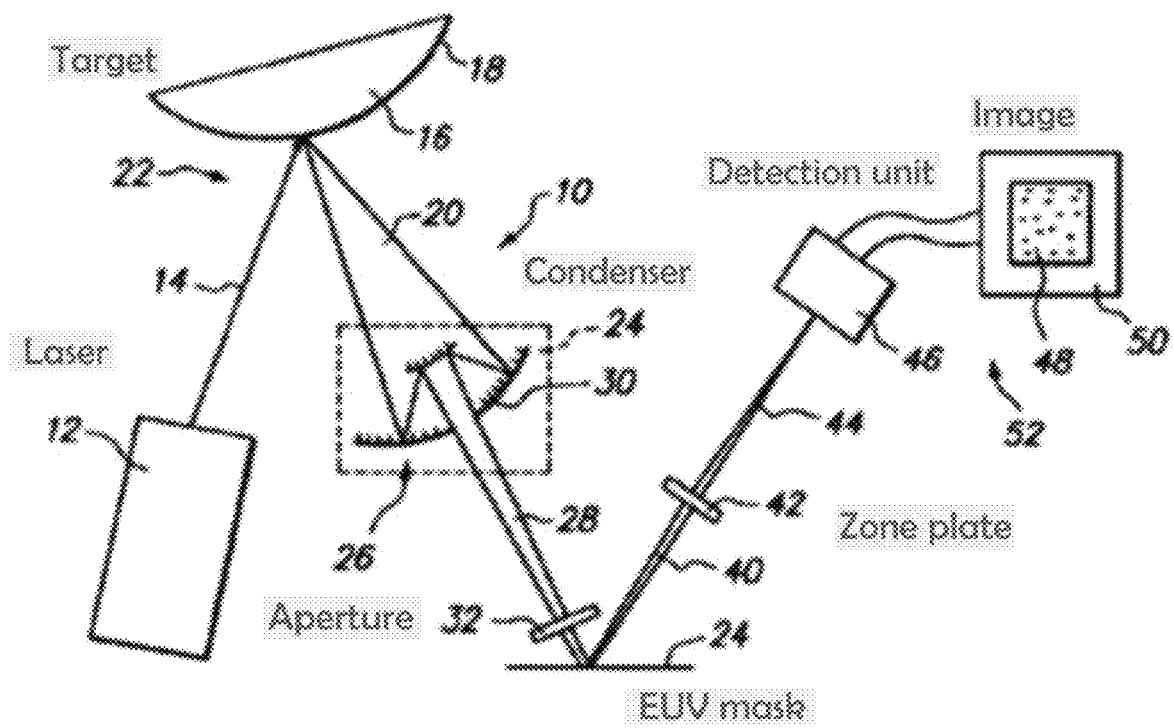
FIG. 1 is a sectional view showing an air-conditioning unit of a conventional two-layered air conditioner for a vehicle.
Figure 2:
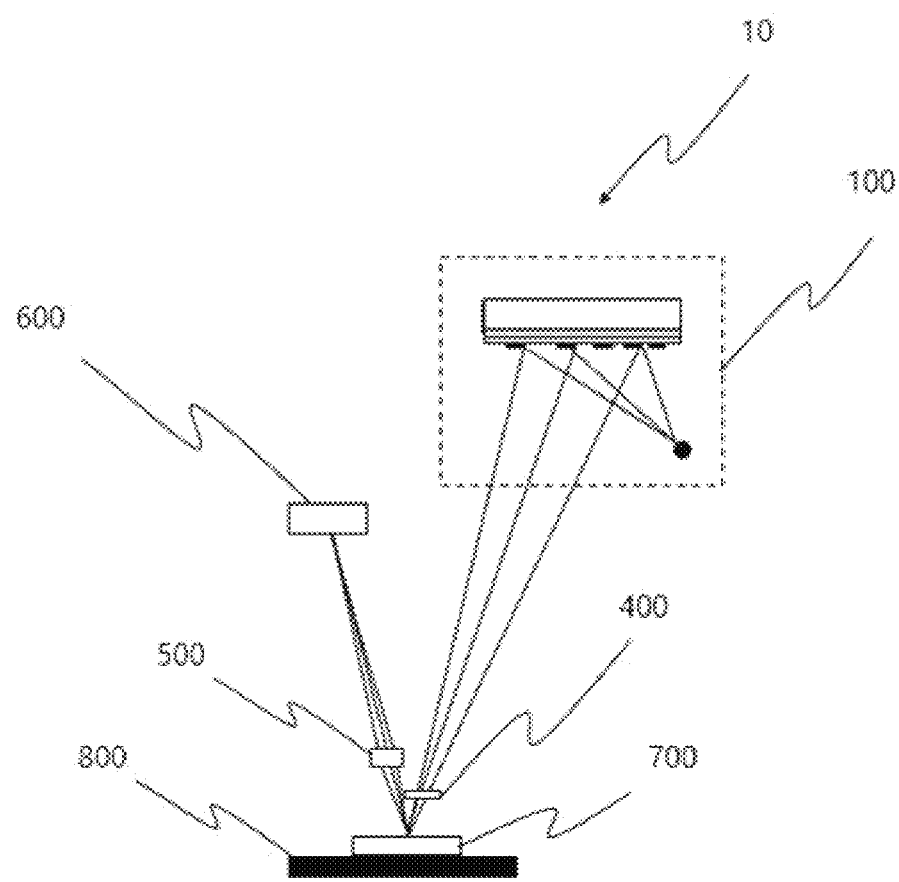
FIG. 2 is a configuration diagram of an EUV mask inspection device using a multilayer reflection zone plate according to the present invention.

FIG. 2 is a configuration diagram of the EUV mask inspection device 10 using the multilayer reflection zone plate according to the present invention.

The inspection device 10 according to the present invention includes one lighting unit 100 having a multilayer reflection zone plate, a transmissive zone plate 500 for detecting a defect of the EUV mask using the lighting unit 100, and an image sensor (CCD) 600. The image sensor 600 acquires light reflected after the measured light radiated from the lighting unit 100 is radiated to the EUV mask, which is an inspection target, so as to detect a defect. In this instance, in order to detect a defect by adjusting the position of the defect using higher resolution, the inspection device 10 according to the present invention further includes a stage 800 for moving the measurement target.

The stage 800 is to transfer the EUV mask, which is the inspection target, in X-axis and Y-axis directions. After X and Y values at the position of the defect generated during the $1^{st}$ measurement process are detected, the stage is operated to move the position of the defect from the measured light to the center with higher resolution, and then, detects the defect of the EUV mask through the $1^{st}$ measurement.

First, referring to FIGS. 3 to 8, the configuration of the lighting unit 100 which is the essential part of the present invention will be described in detail.

Figure 3:
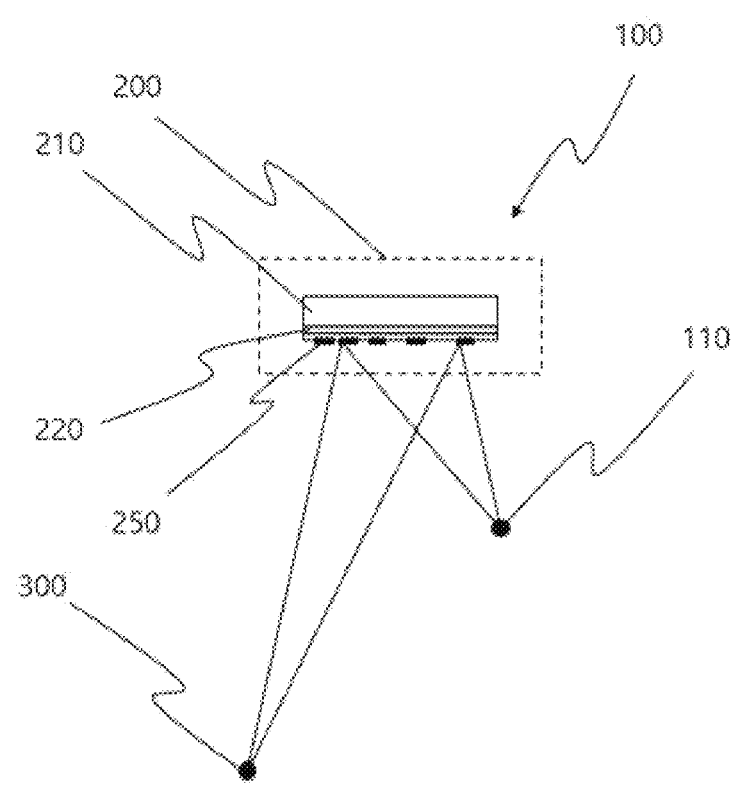
FIG. 3 is a configuration diagram of a lighting unit of the EUV mask inspection device using the multilayer reflection zone plate according to the present invention.

FIG. 3 is a configuration diagram of a lighting unit of the EUV mask inspection device using the multilayer reflection zone plate according to the present invention.

The EUV mask inspection device 10 using the multilayer reflection zone plate 200 according to the present invention is characterized by the lighting unit 100, which forms an EUV reflection multilayer film 220 as a planar substrate, forms a zone plate pattern 250 on the EUV reflection multilayer film 220, and outputs illumination light 300 using light reflected after the EUV light output from the EUV light source 100 is radiated to the zone plate 200.

The EUV lighting unit 100 according to the present invention is to provide a lighting device used for metrology and inspection of an EUV mask in an EUV exposure process of a semiconductor device manufacturing process, and includes one EUV light source 110, and a multilayer reflection zone plate 200 for creating EUV illumination light.

The EUV light generated from the EUV light source 110 makes the multilayer reflection zone plate 200 collect the $1^{st}$ light. The multilayer reflection zone plate 200 has a circular or oval pattern structure to diffract light, is combined with the multilayer film which can reflect the EUV light and diffracts the EUV light in the reflection direction, and collects the $1^{st}$ light of the EUV light. The EUV light source 110 collects Nd:YAG laser or COO2 laser to an Sn or Xe target using a lens or a mirror so as to create plasma. Here, the EUV light source uses light generated from the created plasma, light created from a bending magnet or an undulator of a synchrotron, or light generated from a free electron laser. Here, a wavelength area of the EUV light source ranges from 5 nm to 15 nm, and the wavelength applied to the present invention is the wavelength ranging from 12 nm to 15 nm and light ranging from 6 nm to 7 nm.

The multilayer reflection zone plate 200 for creating EUV illumination light is a reflector for creating illumination light on which an EUV reflective multilayer film is stacked, namely, is a planar substrate 210 on which the EUV reflective multilayer film 220 is stacked and a zone plate pattern 250 is formed on the EUV reflective multilayer film 220. Therefore, the multilayer reflection zone plate creates the EUV illumination light 300 by acquiring the $1^{st}$ diffraction light reflected after the EUV light output from the EUV light source 100 is radiated to the multilayer reflection zone plate.

Figure 4:
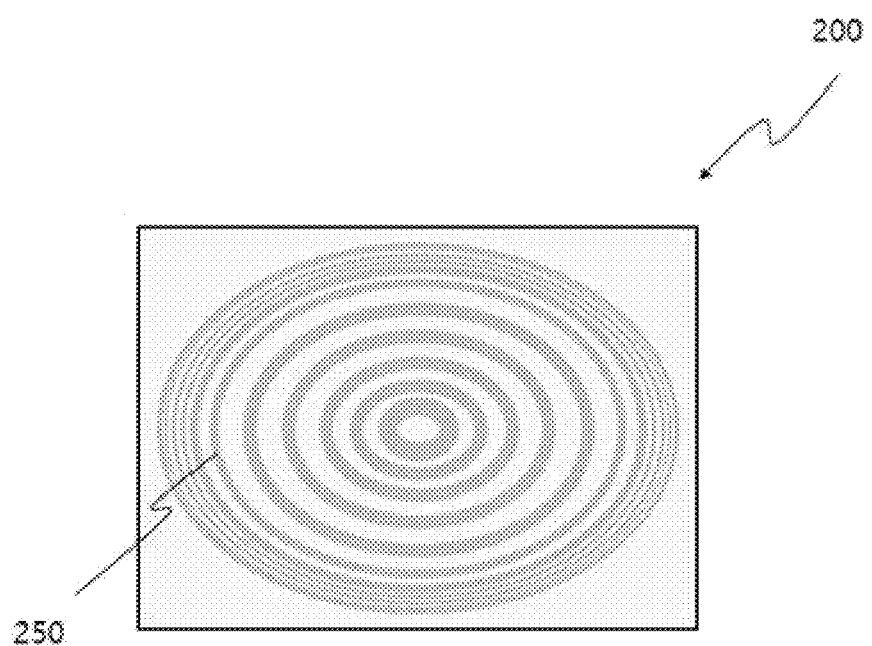
FIG. 4 is a plan view of a multilayer reflection zone plate of the lighting unit of the EUV mask inspection device using the multilayer reflection zone plate according to the present invention.

FIG. 4 is a plan view of a multilayer reflection zone plate of the lighting unit of the EUV mask inspection device using the multilayer reflection zone plate according to the present invention.

As illustrated in the drawing, the multilayer reflection zone plate 200 for creating EUV illumination light is a planar substrate, and forms a zone plate pattern after the EUV reflective multilayer film is stacked on the planar substrate. The multilayer reflection zone plate has a zone plate pattern 250 formed thereon in a circular or oval shape. The multilayer reflection zone plate 200 creates the $1^{st}$ diffraction light used as EUV illumination light through the zone plate pattern.

In this instance, an absorber for forming the zone plate pattern 250 blocks reflection of all lights or reflects some of lights, and can control features of illumination light by controlling reflection of light.

Here, if the height or width or duty cycle of the zone plate pattern is adjusted at each position of the multilayer reflection zone plate 200, $1^{st}$ light efficiency is adjusted at the position. If the $1^{st}$ light diffraction efficiency is adjusted at each position to be a desired amount, the zone plate pattern 250 is lighted since beam is connected by a periodic structure, and intensity of the connected beam by angle is adjusted so as to form intensity distribution of illumination beam by angle like the EUV exposure machine.

Furthermore, it is also possible to uniformly adjust intensity distribution of illumination beam by adjusting $1^{st}$ light efficiency by position of the multilayer reflection zone plate. Such technology is very effective in improvement of EVU inspection performance.

Figure 5:
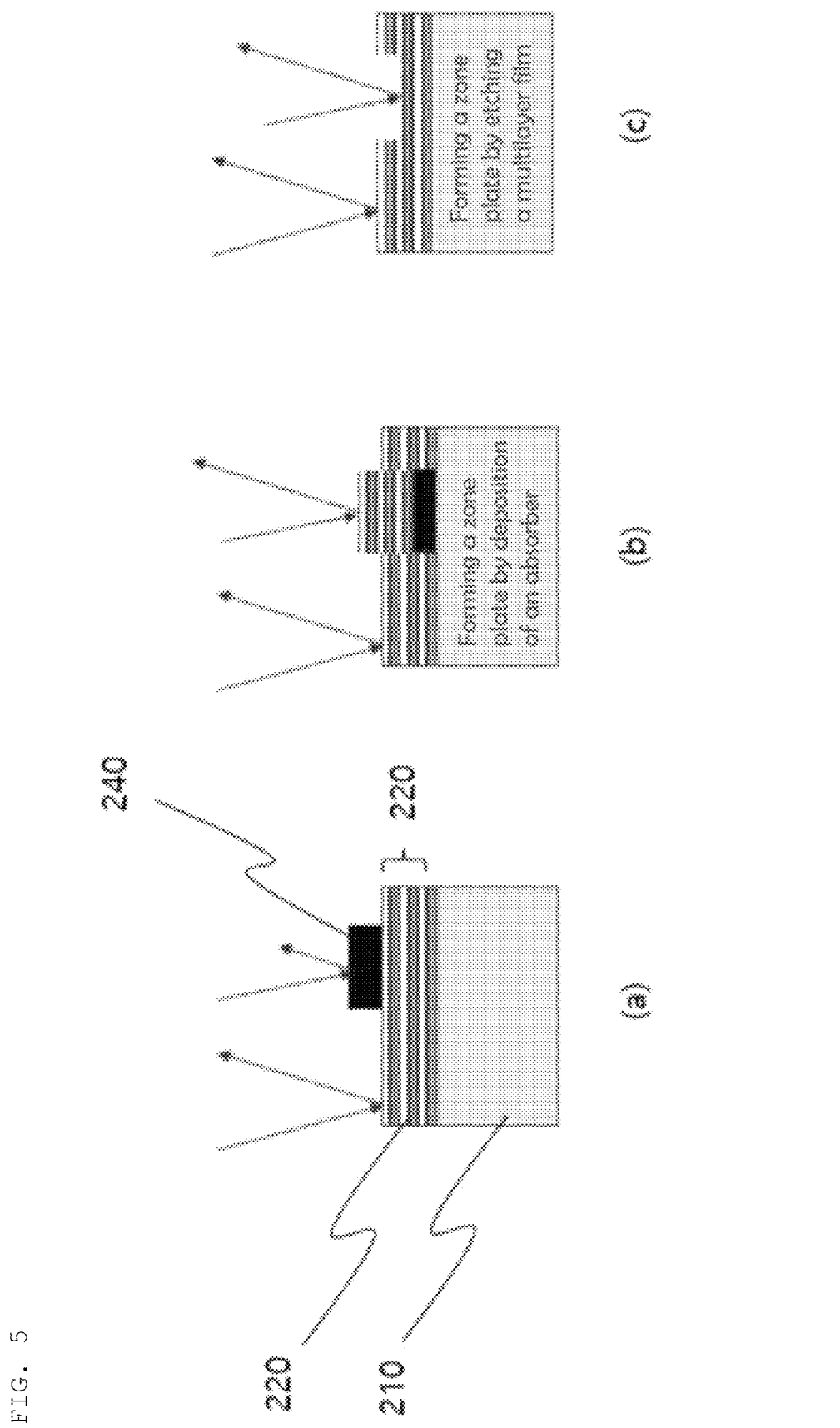
FIG. 5 is a sectional configuration view illustrating various examples of the multilayer reflection zone plate according to the present invention of FIG. 4.

FIG. 5 is a sectional configuration view illustrating various examples of the multilayer reflection zone plate according to the present invention of FIG. 4.

There are various methods to form the multilayer reflection zone plate according to the present invention. As illustrated in FIG. 5(a), an EUV reflection multilayer film 220 for forming a multilayer reflection film is stacked on one planar substrate 210, a plurality of absorbers 240 are formed on the surface of the EUV reflection multilayer film 220 so as to form a zone plate pattern. That is, one zone plate pattern is formed by the plurality of absorbers.

In this instance, the EUV reflection multilayer film is formed in such a way that at least two or more reflective materials are stacked repeatedly, and the absorber 240 can be controlled to absorb incident light or to reflect some of the incident light.

FIG. 5(b) illustrates a structure that the EUV reflection multilayer film is etched and the absorber is formed on the etched EUV reflection multilayer film, so that a zone plate pattern is formed on the inner surface of the multilayer film. In the case of FIG. 5(a), a zone plate pattern is formed on the surface of the multilayer film.

FIG. 5(c) illustrates that the EUV reflection multilayer film is etched along a predetermined pattern and a zone plate pattern is formed on the etched EUV reflection multilayer film.

The absorber 240 for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

Figure 6:
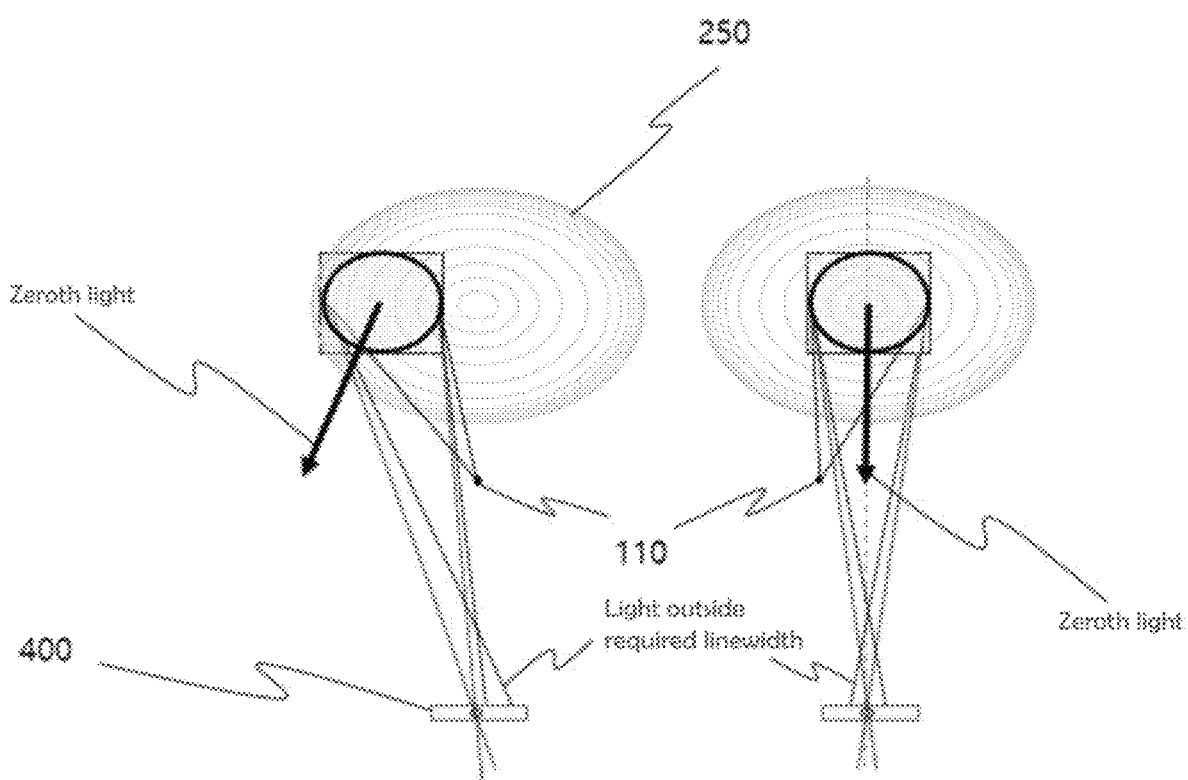
FIG. 6 is a view illustrating a lighting method of the lighting unit using the multilayer reflection zone plate according to the present invention.

FIG. 6 is a view illustrating a lighting method of the lighting unit using the multilayer reflection zone plate according to the present invention.

The zone plate pattern on the multilayer reflection zone plate 200 is formed in a circular or oval shape to collect the EUV light source to a sample. The zone plate may be an off-axis zone plate that the center of the circular or oval pattern does not exist in the multilayer reflection zone plate or an on-axis zone plate that the center of the circular or oval pattern exists in the multilayer reflection zone plate.

In the case of the off-axis zone plate, the center of zeroth light and the center of first light head in different directions, and in the case of the on-axis zone plate, the center of zeroth light and the center of first light are in the same direction. In order to obtain effect to narrow a broad wavelength linewidth of EUV light, an aperture 400 is formed around the collected illumination beam. In this instance, the off-axis zone plate is narrower in linewidth of monochromatic light than the on-axis zone plate since being combined with the aperture, but is shorter in required pattern cycle than the on-axis zone plate. Accordingly, it is possible to select one among the off-axis zone plate and the on-axis zone plate according to the linewidth of light sources and purposes of illumination beam.

If the linewidth of the wavelength of the EUV light source is broad, an aperture is added to create monochromatic light with narrow wavelength line width. The EUV light source used in the EUV lighting device according to the present invention uses EUV light having a wavelength area ranging from 5 nm to 15 nm. Some of users call light near 13.5 nm wavelength EUV light, and call light near 6.7 nm wavelength beyond EUV (BUV) light. In the present invention, wavelength ranging from 5 nm to 15 nm is designated as EUV light.

The EUV light source uses light which is created from plasma generated when Nd:YAG laser or CO2 laser is collected to a Sn or Xe target or is generated from a synchrotron. The present invention provides all technologies applicable to the created EUV light as well as the above-mentioned technology.

Figure 7:
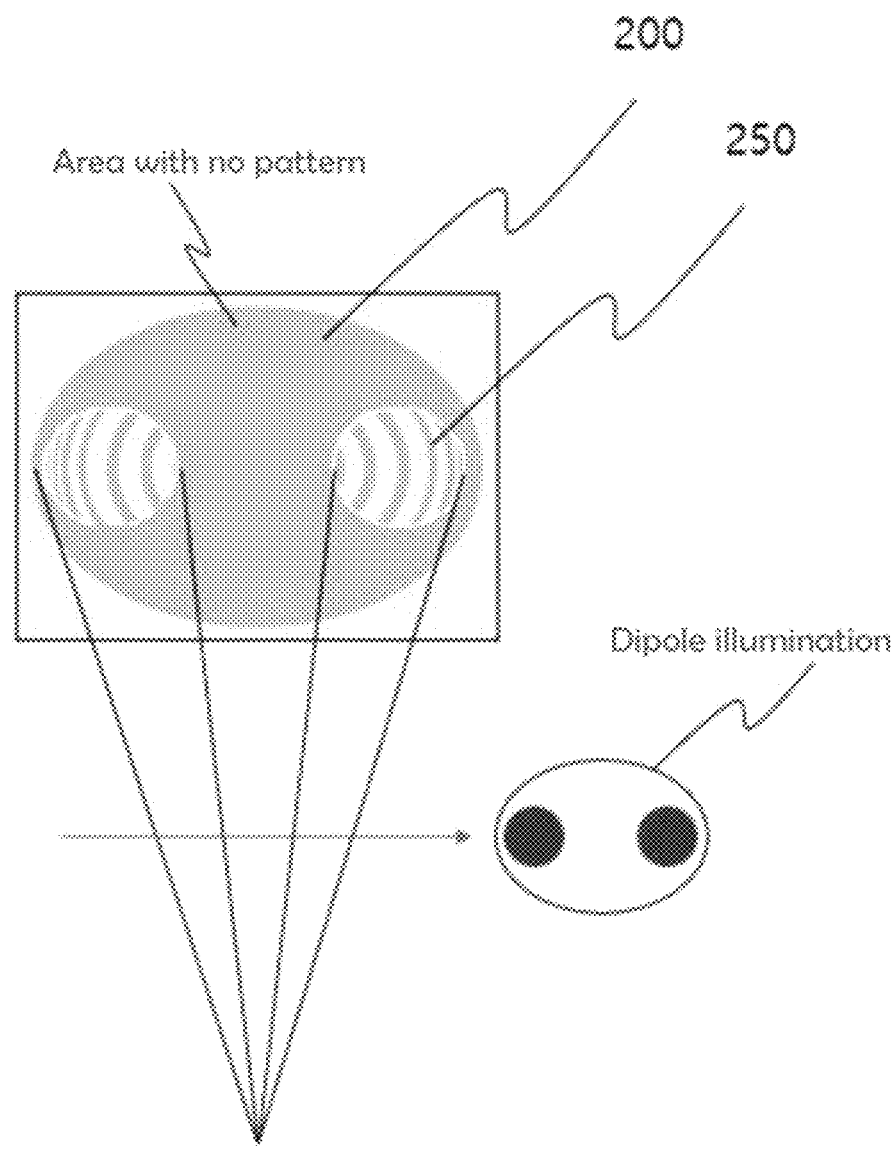
FIG. 7 is a view illustrating another lighting method of the lighting unit using the multilayer reflection zone plate according to the present invention.

FIG. 7 is a view illustrating another lighting method of the lighting unit using the multilayer reflection zone plate according to the present invention.

The multilayer reflection zone plate determines whether or not diffraction of light exists by spatially adjusting whether or not a zone plate pattern exists on the multilayer reflection zone plate so as to embody binary illumination, and the binary illumination is applied to an EUV microscope so as to confirm optimization conditions for improving resolution of the microscope. Therefore, the binary illumination can be applied to be optimized in inspection sensitivity improvement of an inspection machine.

Figure 8:
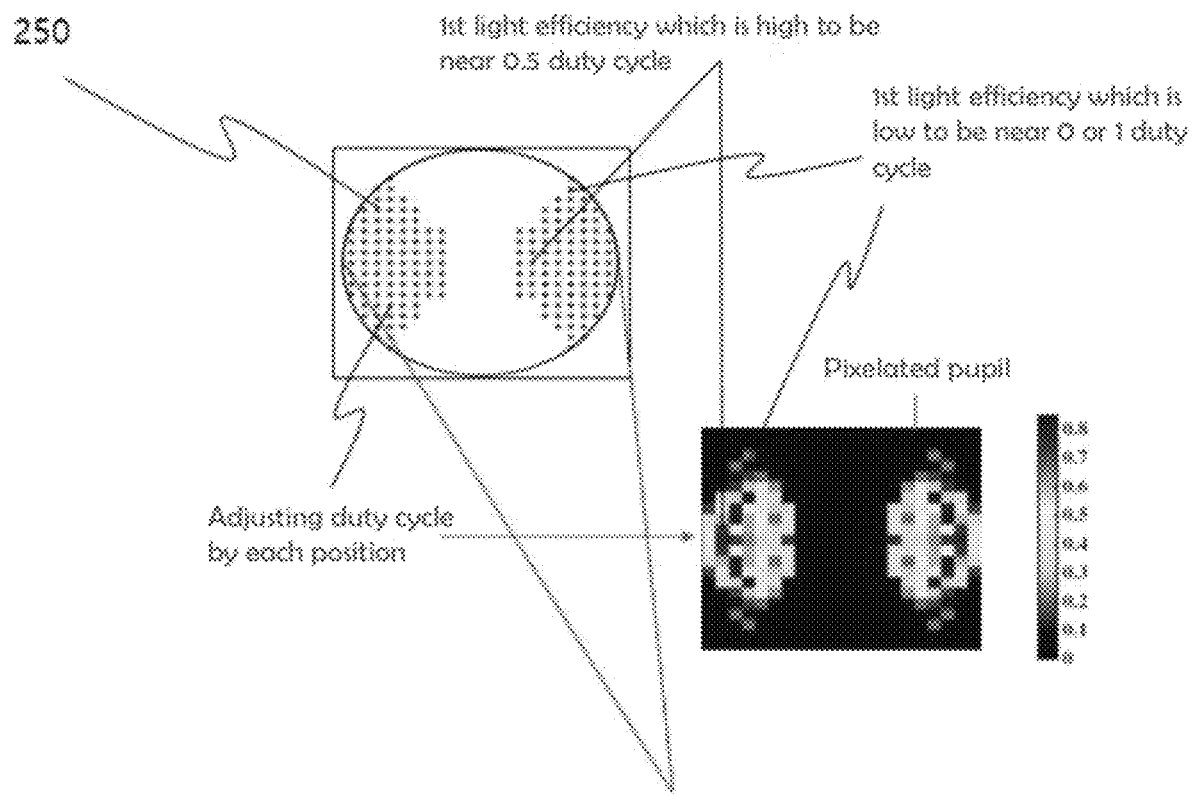
FIG. 8 is a detailed configuration diagram illustrating illumination light control of the EUV mask inspection device using the multilayer reflection zone plate according to the present invention.

FIG. 8 is a detailed configuration diagram illustrating illumination light control of the EUV mask inspection device using the multilayer reflection zone plate according to the present invention. When a duty cycle of a zone plate pattern or the height of absorber is spatially adjusted on the multilayer reflection zone plate, intensity of $1^{st}$ diffraction light in the spatial part is adjusted so as to embody freeform pupil illumination or pixelated pupil illumination. The freeform pupil illumination is applied to be optimized in improvement of resolution of a microscope or improvement of inspection sensitivity of an inspection machine, or the freeform pupil illumination is optimized to improve uniformity of beam radiated to a sample.

Hereinafter, the EUV mask inspection device having the lighting unit utilizing the multilayer reflection zone plate described above will be described.

Figure 9:
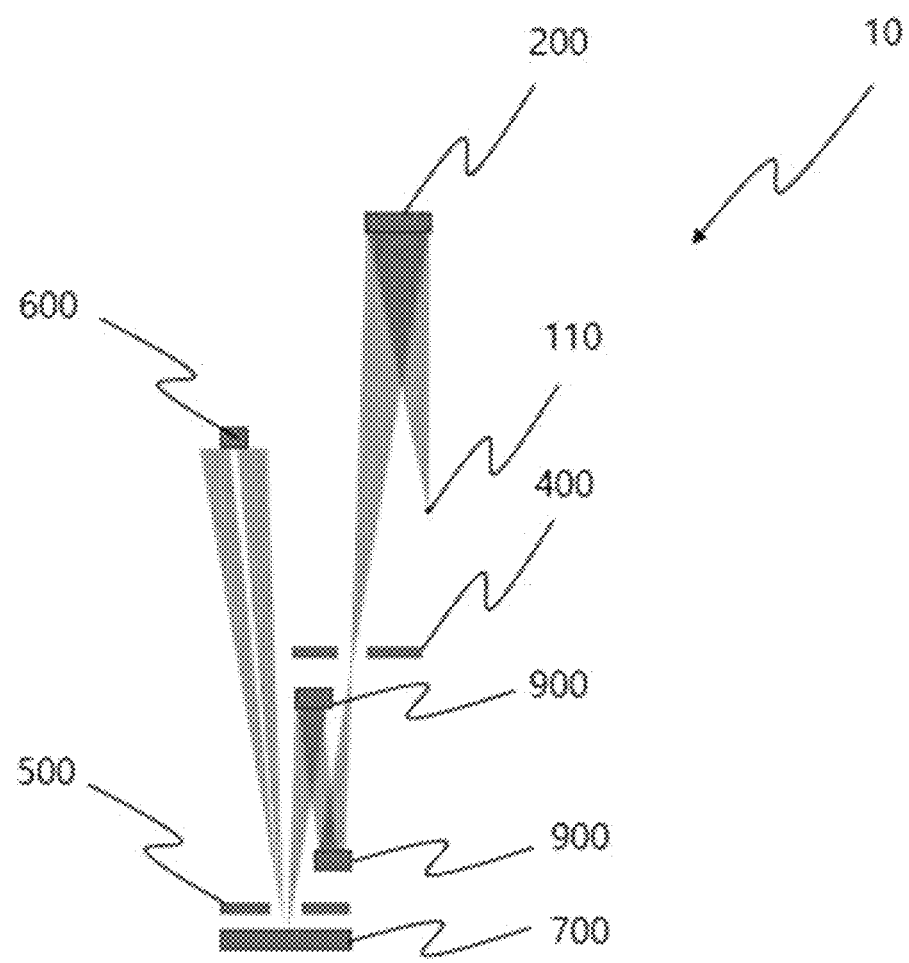
FIGS. 9 to 11 are configuration diagrams illustrating various examples of the EUV mask inspection device using the multilayer reflection zone plate according to the present invention.
Figure 10:
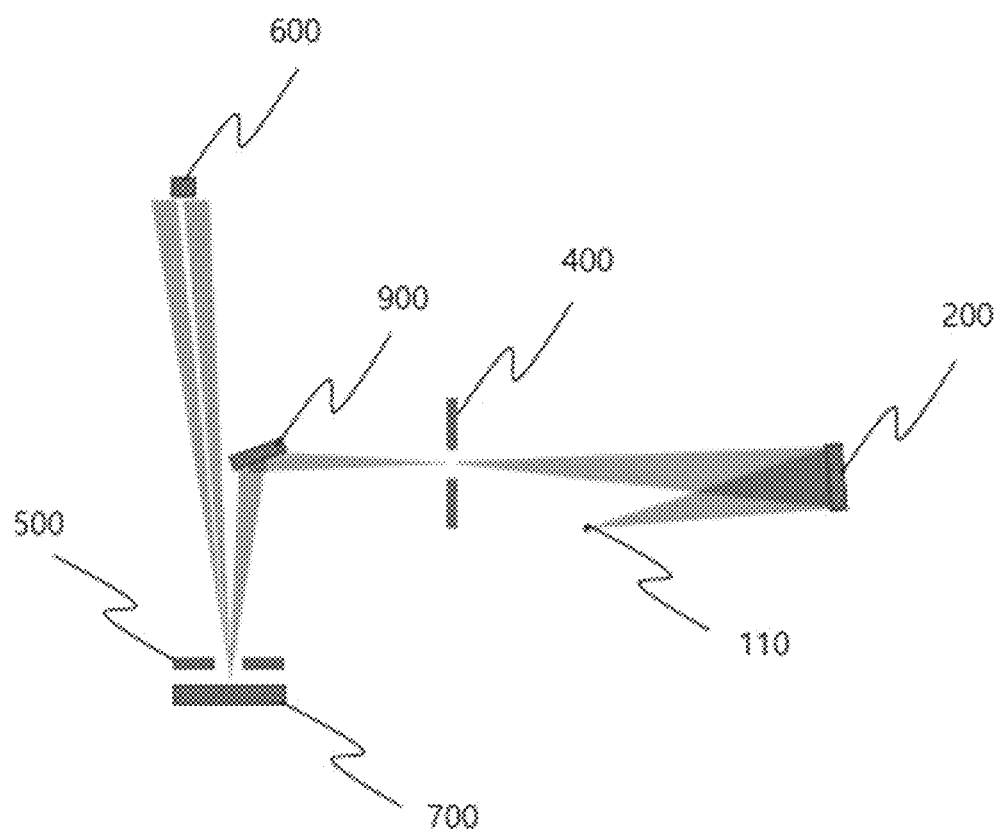
Figure 11:
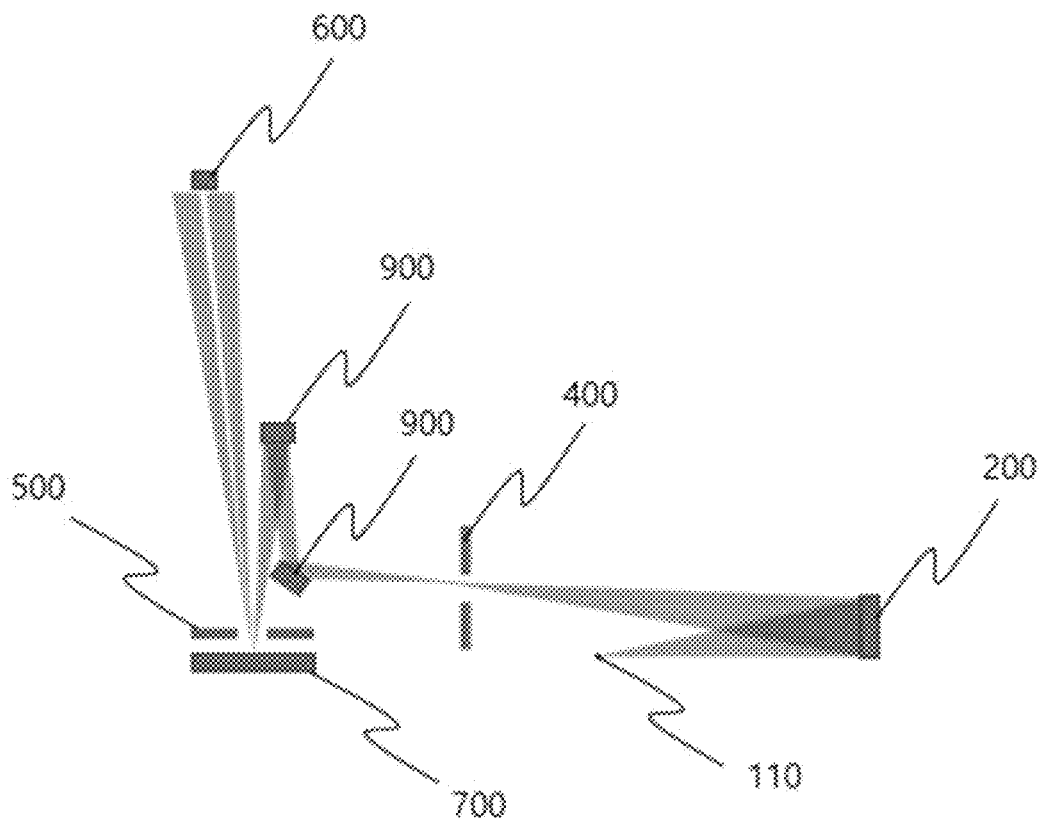

FIGS. 9 to 11 are configuration diagrams illustrating various examples of the EUV mask inspection device using the multilayer reflection zone plate according to the present invention. FIGS. 9 to 11 illustrate that an optical path and locations of optical parts may be arranged in various ways according to arrangement of the parts through various combination structures of the optical parts.

The EUV mask inspection device further includes a plurality of reflection mirrors 900 for controlling the direction of output measured light by determining the location of the lighting unit. The EUV mask inspection device which has at least one reflection mirror can determine the location and direction of the lighting unit and determine the optical path of the EUV mask inspection device.

The EUV mask inspection device can set the optical path and determine the optical direction through the plurality of reflection mirrors to provide a spatial limitation and easiness in installation according to a mechanical arrangement of the inspection device. In this instance, the reflection mirror may be one or a combination of two selected from a plane mirror, a concave mirror, an elliptic mirror, and a toroidal mirror.

Here, the reflection mirror may be a mirror having an EUV reflective multilayer film stacked on the surface thereof, and a zone plate pattern formed on the surface or the inner face of the EUV reflective multilayer film.

Therefore, FIG. 9 illustrates that two reflection mirrors are applied to inject light after reflecting the measured light twice, and FIGS. 10 and 11 illustrate a path that the EUV light output horizontally from one side is injected into a measurement target through the plane mirror and the concave mirror.

Figure 12:
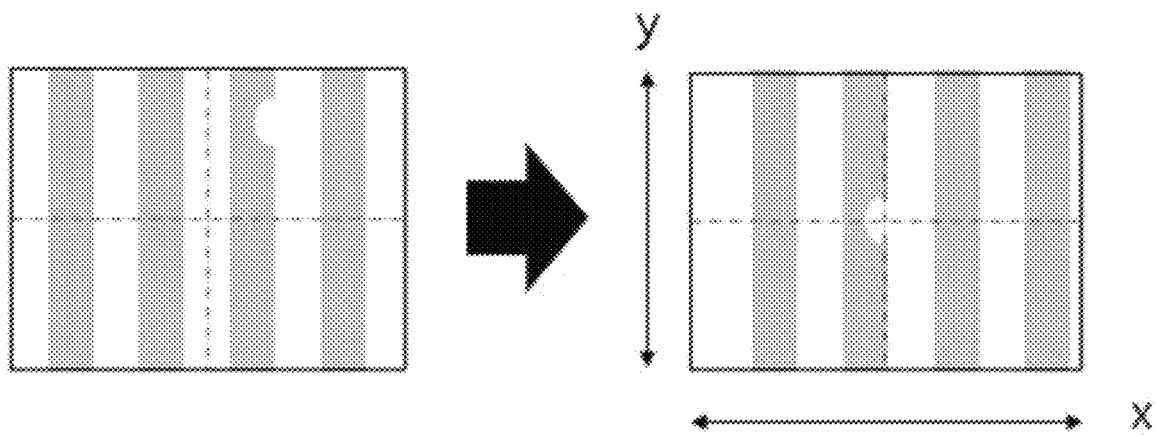
FIG. 12 is a view illustrating measurement for improving defected resolution through movement of an EUV mask in the EUV mask inspection device using the multilayer reflection zone plate according to the present invention.

FIG. 12 is a view illustrating measurement for improving defected resolution through movement of an EUV mask in the EUV mask inspection device using the multilayer reflection zone plate according to the present invention.

The EUV mask inspection device acquires X- and Y-axis values in relation to the detected defect after analyzing the position of a defect through the first measured image analysis in order to enhance resolution of the detected defect, and operates the stage 800 to move the EUV mask toward the center of the measured light with high resolution, and then, acquires an image through the second detection to precisely analyze the position and size of the defect. The stage 800 can transfer and control an operation value according to coordinate values by reflecting the coordinate values acquired through a control unit.

Figure 13:
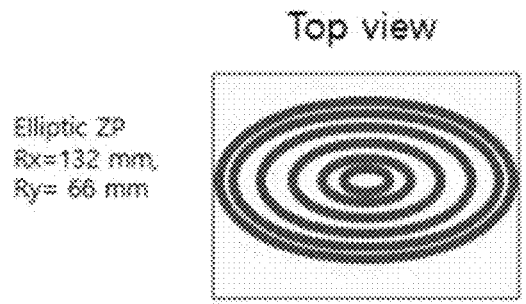
FIG. 13 is a configuration diagram illustrating a multilayer reflective zone plate and a transmissive zone plate according to the present invention.
Figure 13:
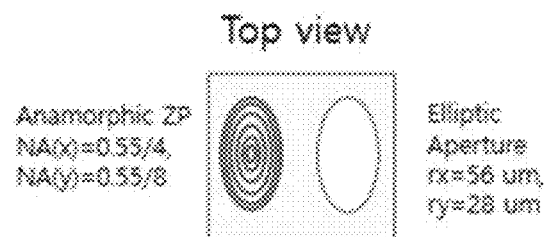
Figure 13:
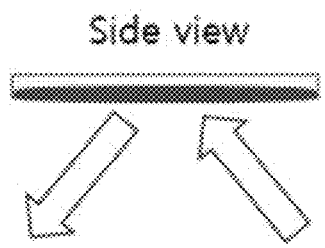
Figure 13:
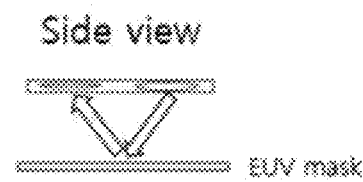

FIG. 13 is a configuration diagram illustrating a multilayer reflective zone plate and a transmissive zone plate according to the present invention.

Now, an EUV inspection device of a microscopic structure for measuring an aerial image in the same way as a high NA EUV exposure machine having an anamorphic NA, wherein NA(x) is 0.55 and NA(y) is 0.55/2 will be described.

A laser produced plasma (LPP) is used as the EUV light source, 100 W Nd:YAG laser is radiated to an Sn target to create LPP, EUV light with a linewidth of 2 W+/−1% and central wavelength of 13.5 nm is generated from the LPP, an oval multilayer reflection zone plate (MRZ) which is 132 mm in X-axis diameter and 66 mm in Y-axis diameter is installed to be 300 mm distant from the light source, light of 2.4 mW is collected in the direction of the EUV mask by the multilayer reflection zone plate which has a solid angle of 0.075 sr (steradian) and the $1^{st}$ light diffraction efficiency of 20%, the collected light passes through the oval aperture which is 56 um mm in X-axis diameter and 28 um in Y-axis diameter before reaching the EUV mask, and the wavelengths having different collection points by the chromatic aberration of the multilayer reflection zone plate are removed by the aperture, so that the light reaching the EUV mask becomes monochromatic light with improved linewidth of lambda/600 and light intensity of 0.2 mW.

In this instance, beam radiated to the EUV mask has the same maximum sigma, which is 1, as a high NA exposure machine having NA(x) of 0.1375 (=0.55/4) and NA(y) of 0.06875 (=0.55/8). Moreover, the beam radiated to the EUV mask can realize the same freeform pupil (in various intensity distributions at various incidence angles) as the high NA exposure machine through adjustment of a spatial duty cycle (DC) or height of the pattern in the multilayer reflection zone plate.

Figure 14:
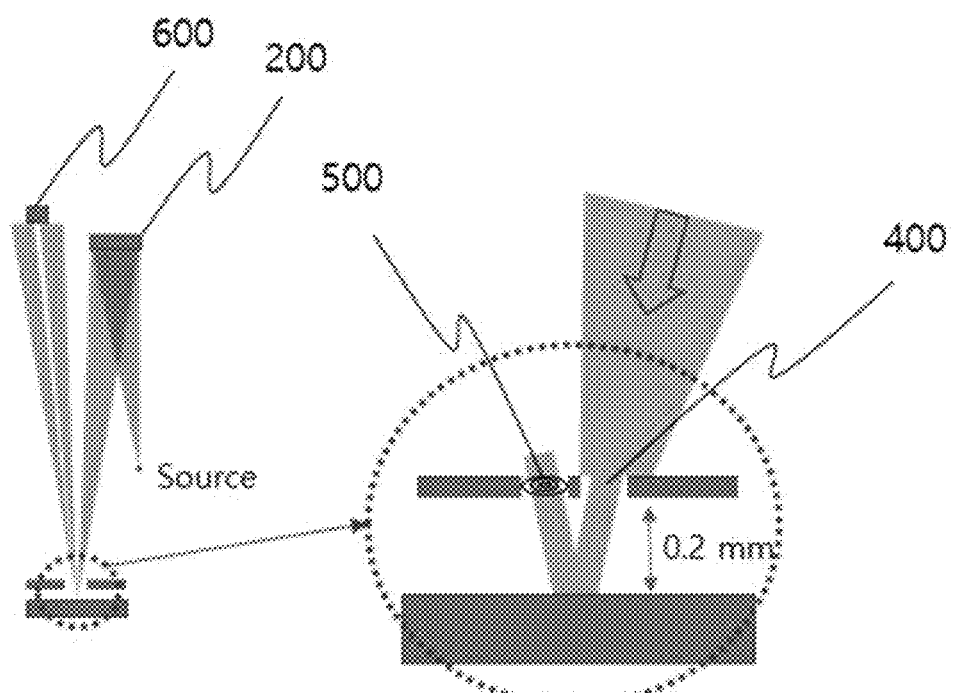
FIG. 14 is a detailed configuration diagram of the EUV mask inspection device using the multilayer reflection zone plate according to the present invention.

FIG. 14 is a detailed configuration diagram of the EUV mask inspection device using the multilayer reflection zone plate according to the present invention.

The light collected by the multilayer reflection zone plate is radiated to the EUV mask after passing through the aperture. Considering that the optical power density of the EUV mask 0.2 mm distant from the aperture is about 1.47 w/cm$^2$ in a near-FOV 5 um area and energy of one EUV photon is $91*1.6*10^{-19}$ Joule, light with optical density per seconds of about 1009 photons/s/nm$^2$ is radiated to the EUV mask.

TABLE 1

| | |
|---|---|
| EUV source size(e^(−2)) | 60 |
| Source to MRZ distance(mm) | 300 |
| MRZ focal length(mm) | 182.353 |
| MRZ to aperture distance(mm) | 465 |
| Beam size at aperture(e^(−2)) | 93 |
| Power density at aperture(W/cm^2) | 1.47 |
| Photon denisty per second at EUV mask(photon number/s/nm^2) | 1009 |

Figure 15:
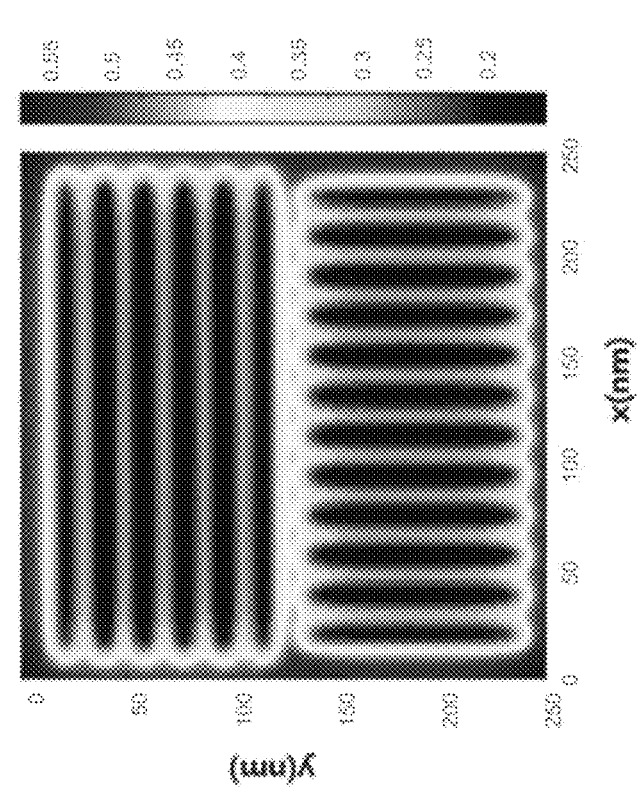
FIG. 15 is a view illustrating an example of a simulation according to the EUV mask inspection device using the multilayer reflection zone plate according to the present invention.
Figure 15:
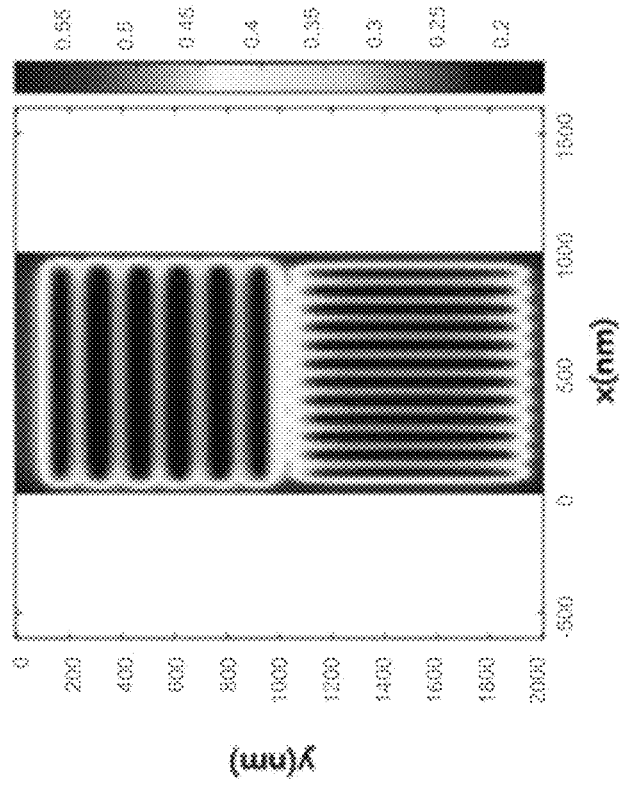

FIG. 15 is a view illustrating an example of a simulation according to the EUV mask inspection device using the multilayer reflection zone plate according to the present invention. FIG. 15 is an example of a EUV inspection simulation showing the function of the high NA EUV exposure machine capable of measuring an aerial image on a wafer surface.

If a vertical line & space pattern having a half cycle of 38 nm is formed in the X-axis direction and a horizontal line & space pattern having a half cycle of 76 nm is formed in the y-axis direction, when an image is acquired to the transmissive zone plate with NA=0.55/4 in the x-axis direction and NA=0.55/8 in the y-axis direction, the following image is shown on the EUV mask surface. If the image is reduced to ¼ and ⅛ respectively in the x-axis direction and in the y-axis direction, the half cycle of the pattern in all directions is 9.5 nm, and it is the same as the aerial image shown on the wafer surface of the high NA EUV exposure machine having an anamorphic projection optical system.

The inspection device according to the present invention can be easily applied to apparatuses, is short in a development period of time, and requires low expenses since having a smaller number of components than the conventional optical system having the existing mirror.

Because the reflection zone plate not to which the existing oblique incidence reflection zone plate parts are applied does not have the multilayer film, beam is injected into the zone plate at oblique incidence (at an incidence angle of 86 degrees) for soft ray reflection and solid angles collected to the zone plate are small. Therefore, the present invention can solve the problem that light harvesting efficiency is deteriorated.

As described above, while the present invention has been particularly shown and described with reference to the example embodiments thereof, it will be understood by those of ordinary skill in the art that various changes, modifications and equivalents may be made in the present invention without departing from the technical scope and idea of the present invention. Therefore, it would be understood that the present invention is not limited by the changes, modifications and equivalents but is limited by the following claims.

What is claimed is:

1. An EUV mask inspection device using a multilayer reflection zone plate for metrology and inspection of an EUV mask used in an EUV exposure process during a semiconductor device manufacturing process, which comprises: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate, and the EUV mask inspection device comprising:
   an aperture for providing monochromatic light or reducing a light radiation area by reducing a linewidth of optical wavelength radiated from the EUV lighting unit;
   a transmissive zone plate for forming expanded light by collecting reflected or scattered light after radiating light passing through the aperture to the EUV mask; and
   an image sensor for measuring intensity of light through EUV mask measured light, which is the light passing through the transmissive zone plate.

2. The EUV mask inspection device according to claim 1, wherein the multilayer reflection zone plate comprises:
   one planar substrate;
   an EUV reflective multilayer film stacked on the planar substrate; and
   a zone plate pattern formed on the surface or the inner face of the EUV reflective multilayer film.

3. The EUV mask inspection device according to claim 2, wherein the zone plate pattern is formed on the EUV reflective multilayer film by repeatedly stacking at least two or more reflective materials, and
   wherein the zone plate pattern is formed in such a way that absorber materials are stacked along a predetermined pattern, that the EUV reflection multilayer film is etched along the predetermined pattern, or that an absorber material is stacked and the EUV reflection multilayer film is stacked on the absorber material.

4. The EUV mask inspection device according to claim 3, wherein the zone plate pattern is formed on the surface or the inner face of the EUV reflective multilayer film in such a way that absorber materials are stacked along a predetermined pattern, that the EUV reflection multilayer film is etched along the predetermined pattern, or that an absorber material is stacked and the EUV reflection multilayer film is stacked on the absorber material.

5. The EUV mask inspection device according to claim 3, wherein the absorber for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

6. The EUV mask inspection device according to claim 3, wherein the zone plate pattern adjusts the $1^{st}$ light intensity by adjusting the height or the duty cycle of the absorber, and adjusts intensity distribution by angles of beam by spatially adjusting the $1^{st}$ light intensity in the multilayer reflection zone plate.

7. The EUV mask inspection device according to claim 3, wherein the zone plate pattern has a circular or oval shape,
   wherein the zone plate is an off-axis zone plate that the center of the circular or oval pattern does not exist in the multilayer reflection zone plate, or is an on-axis zone plate that the center of the circular or oval pattern exists in the multilayer reflection zone plate, and
   wherein in the case of the off-axis zone plate, the center of zeroth light and the center of first light head in different directions, and in the case of the on-axis zone plate, the center of zeroth light and the center of first light are in the same direction.

8. The EUV mask inspection device according to claim 3, wherein the zone plate pattern determines whether or not diffraction of light exists by spatially adjusting whether or not a zone plate pattern exists on the multilayer reflection zone plate so as to embody binary illumination.

9. The EUV mask inspection device according to claim 4, wherein the absorber for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

* * * * *